United States Patent [19]

Tehrani et al.

[11] Patent Number: 5,748,519
[45] Date of Patent: May 5, 1998

[54] METHOD OF SELECTING A MEMORY CELL IN A MAGNETIC RANDOM ACCESS MEMORY DEVICE

[75] Inventors: Saied N. Tehrani; Herbert Goronkin, both of Tempe, Ariz.

[73] Assignee: Motorola, Inc., Schaumburg, Ill.

[21] Appl. No.: 766,637

[22] Filed: Dec. 13, 1996

[51] Int. Cl.⁶ .................................................. H01L 21/78
[52] U.S. Cl. .......................... 365/98; 365/170; 365/171
[58] Field of Search ........................... 365/170, 171, 365/2, 9, 87, 5, 7, 8, 10, 98

[56] References Cited

U.S. PATENT DOCUMENTS 5,361,226  11/1994  Taguchi et al. .................. 365/171
5,396,455  3/1995   Brady et al. ..................... 365/170
5,477,482  12/1995  Prinz ................................ 365/129

*Primary Examiner*—Vu A. Le
*Attorney, Agent, or Firm*—Eugene A. Parsons

[57] ABSTRACT

Improved methods for selecting memory cells in magnetic random access memory (MRAM) are provided. Whenever a state in a memory cell is sensed, a MRAM requires to adjust an output of comparator to a zero voltage (auto-zeroing step) before the content of memory cell is detected. This invention sequentially accesses memory cells 29-30 once sense line 25 is selected and auto-zeroed. Accordingly, a higher speed operation is attained because the invention does not require an auto-zeroing step every sensing a memory cell.

15 Claims, 5 Drawing Sheets

FIG. 2
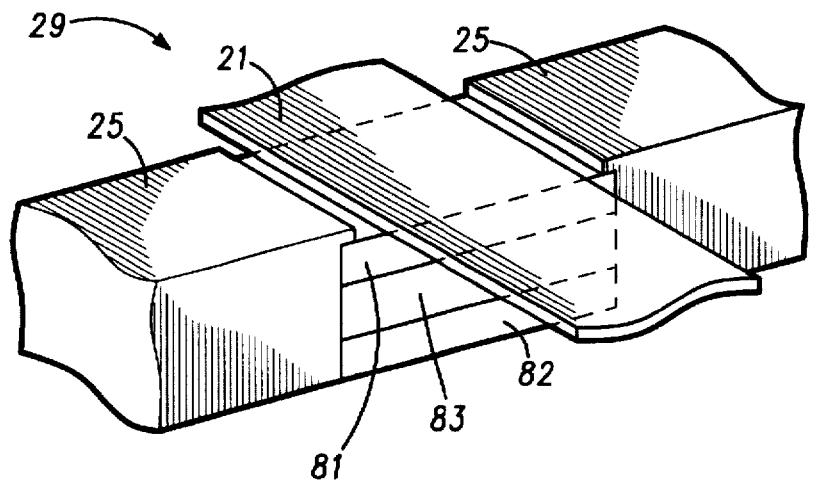
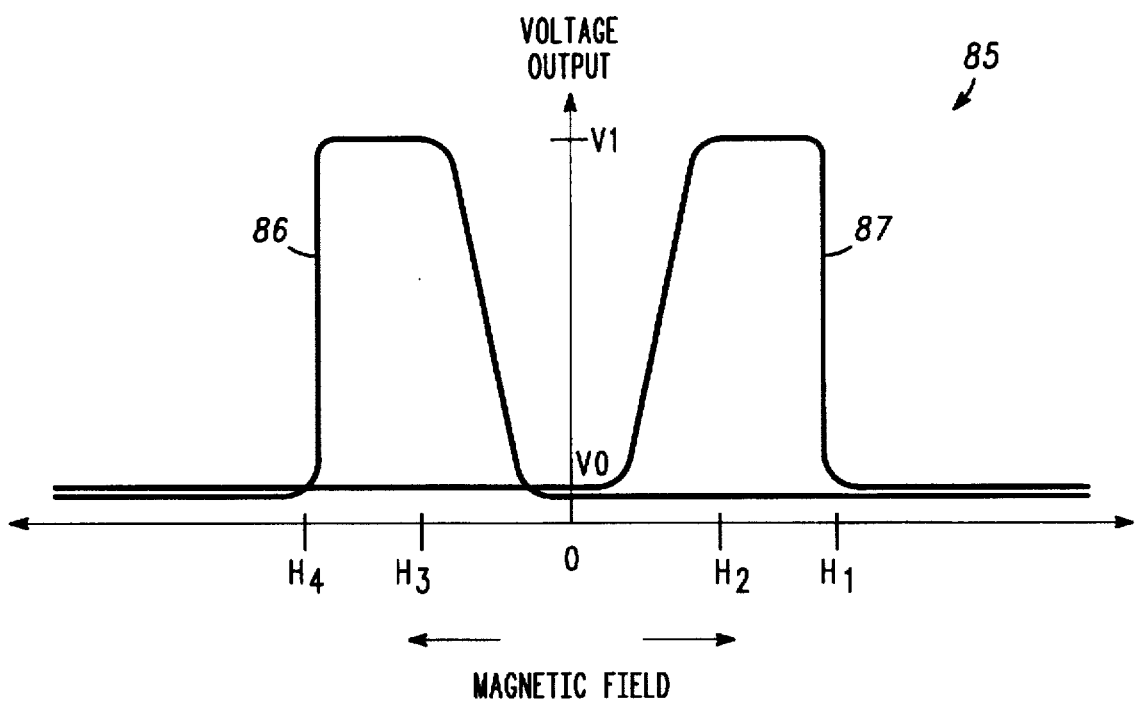
FIG. 3

METHOD OF SELECTING A MEMORY CELL IN A MAGNETIC RANDOM ACCESS MEMORY DEVICE

FIELD OF THE INVENTION

The present invention relates to a method for selecting a memory cell in a magnetic random access memory device, and more particularly, to the method of sequentially selecting a word line to provide a word current.

BACKGROUND OF THE INVENTION

A magnetic random access memory (MRAM) typically consists of a plurality of memory cells arrayed on intersections of word lines and sense lines, each cell having two magnetic layers separated by a conductive or insulating layer. Digital information is represented as a direction of magnetic vectors in the magnetic layers and the information indefinitely remains in a given state until the information is intentionally changed by an opposite magnetic field over a threshold level. In order to write or change a state in the memory cell, a total magnetic field generated by a word current and a sense current is applied to the memory cell that is sufficient to switch the direction of the magnetic vectors in the magnetic layers. To read the state in the memory cell, an output voltage of a comparator, inputs of which are connected to a sense line, is initially auto-zeroed after a word current is applied. Then, a reverse word current is applied and a voltage change is sensed to determine a state in the memory cell.

In the prior MRAM, a reading step always requires an auto-zeroing step before the state in the memory cell is sensed. The auto-zeroing step totally wastes much time to read all memory cells.

Accordingly, it is a purpose of the present invention to provide a new and improved method of activating memory cells in a MRAM device which attains a high speed operation specifically in a reading process.

SUMMARY OF THE INVENTION

This need and others are substantially met through provision of a method which sequentially selects a word line and provides a word current in each word line once a sense line is selected and auto-zeroed so that a total access time to the MRAM device is dramatically reduced.

BRIEF DESCRIPTION OF THE DRAWINGS

FIG. 2 shows a simplified and enlarged memory cell structure with magnetic material.

FIG. 3 shows a graph illustrating characteristics of the GMR material shown in FIG. 2.

DETAILED DESCRIPTION OF THE PREFERRED EMBODIMENTS

Figure 1:
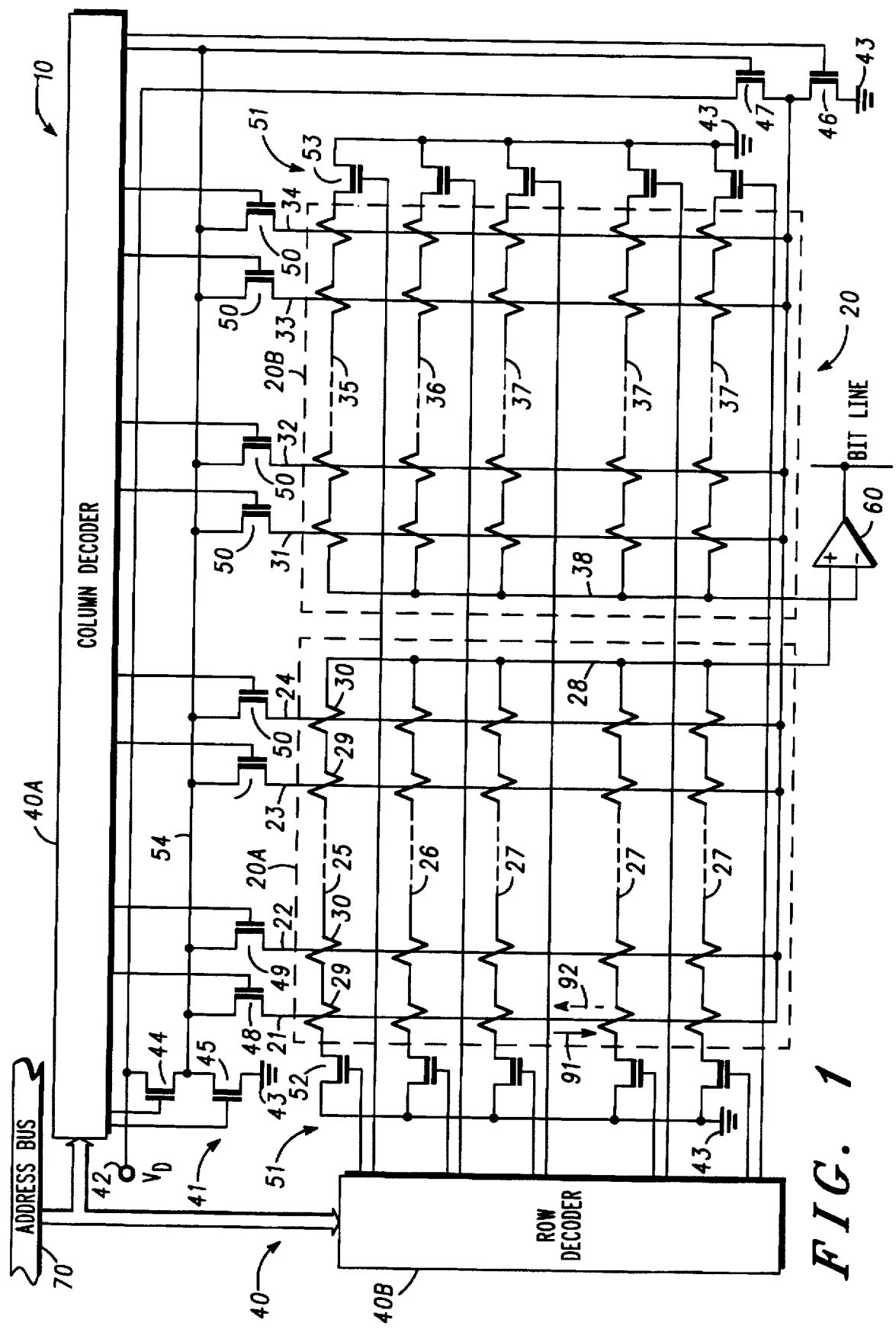
FIG. 1 shows simplified MRAM circuitry having a memory array where a plurality of memory cells is arranged.

FIG. 1 shows simplified MRAM circuitry 10 having a memory array 20 where a plurality of memory cells are arranged on intersections of word lines and sense lines. MRAM circuitry 10 is generally fabricated on a semiconductor substrate, and other circuits may be integrated on the same substrate. A structure and characteristics of a typical memory cell are explained hereinafter in the discussion of FIGS. 2 and 3.

MRAM 10 consists of memory array 20, a decoder 40, and a comparator 60. Memory array 20 is logically divided into first and second array portions 20a and 20b, indicated by dashed boxes. Decoder 40 consists of a column decoder 40a and a row decoder 40b which are coupled to an address bus 70, respectively. Word lines 21–24 and 31–34 are coupled to column decoder 40a through a column switching circuit 41. Sense lines 25–27 and 35–37 are coupled to row decoder 40b through a row switching circuit 51. Word lines 21–24 and 31–34 and sense lines 25–27 and 35–37 have intersections in memory array 20 on which memory cells are placed. For example, a memory cell 29 in first memory array portion 20a is positioned on an intersection of word line 21 and sense line 25. Selection of word line 21 and sense line 25 activates memory cell 29, thereby read and write processes are carried out. Output lines 28 and 38 of sense lines 25–27 and 35–37 are connected to positive and negative inputs of comparator 60, respectively.

Column decoder 40a includes column switching circuit 41 which switches word lines 21–24 and 31–34 between a first potential or a power line 42 and a second potential or a ground line 43. Gate electrodes of transistors 44 and 45 are connected to column decoder 40a, respectively. The gates of column transistors 48–50 in column switching circuit 41 are also connected to column decoder 40a. Drain and source electrodes of column transistors 48–50 are connected to line 54, which is connected to column decoder 40a and a gate of a switching transistor 47, and sense lines 21–24 and 31–34, respectively.

Row decoder 40b includes row switching circuit 51 which connects sense lines 25–27 and 35–37 to ground line 43. One end of each of sense lines 25–27 and 35–37 are connected together to positive and negative inputs of comparator 60, respectively by lines 28 and 38. Other ends of sense lines 25–27 and 35–37 are connected to ground line 43 through row switching circuit 51. Gate electrodes of row transistors 52 and 53, for example, are connected to row decoder 40b. Other row transistors in row switching circuit 51 are also connected in the same way as transistors 52 and 53.

FIG. 2 shows a perspective view of a simplified and enlarged structure of a memory cell 29 having multiple layers of magnetic material. Other memory cells also have the same structure as memory cell 29. Memory cell 29 has a first magnetic layer 81 and a second magnetic layer 82 separated by a conductive layer 83. Layers 81 and 82 utilize magnetic material such as NiFeCo, and conductive layer 83 utilizes, for example, Copper (Cu). The three layers 81, 82, and 83 together form a giant magneto-resistive (GMR) material. Word line 21, which carries a word current, is placed adjacent first layer 81 in order to provide the GMR material with a magnetic field generated by the word current. Sense line 25, which carries a sense current, is connected to the GMR with an ohmic contact to sense a magnetic resistance.

Memory cell 29 shown in FIG. 2 can be stacked on the top of other memory cells to attain memory array 20 having multiple layers of memory cells. The design of such memory stacks can be engineered to produce a random access memory device having a plurality of pairs of memory cells, as disclosed in U.S. patent application entitled "A MAGNETIC RANDOM ACCESS MEMORY HAVING STACKED MEMORY CELLS AND FABRICATION METHOD THEREFOR", filed Aug. 23, 1996, (Ser. No. 08/702,781) and assigned to the same assignee.

In order to store or write a state in magnetic layers 81 and 82, a total magnetic field, which is created by magnetic fields provided by the word current and the sense current sufficient to switch the direction of magnetic vectors in magnetic layers 81 and 82, is applied to magnetic layers 81 and 82. To read the state in magnetic cell 29, a voltage on sense line 25 is sensed because the voltage changes according to the direction of magnetic vectors in magnetic layers 81 and 82.

FIG. 3 shows a graph 85 illustrating the resistance or voltage output of magnetic cell 29 (FIG. 2) verses the applied magnetic field or total magnetic field. The abscissa indicates magnetic field direction and strength, that is, the strength either supports or opposes the magnetic vectors of cell 29. The ordinate represents the voltage output of cell 29. A curve 86 indicates the magnetoresistance characteristic, via the output voltage, for various magnetic field intensities for one direction of magnetization vectors. A curve 87 indicates the magnetoresistance characteristic, via the output voltage, for the same magnetic field intensities for the opposite direction of magnetization vectors. To the right of zero, curves 86 and 87 indicate the output voltage for magnetic fields that support the vectors of curve 86 and oppose the vectors of curve 87, and magnetic fields to the left of zero support the vectors of curve 87 and oppose the vectors of curve 86. Typically, curves 86 and 87 cross the voltage axis at the same point and have the same minimum values. For the sake of explanation, curve 87 is shifted vertically a slight amount to show the differences between the curves.

At zero applied field, the voltage output ($V_o$) of cell 29 is approximately the same regardless of the magnetization vector direction. As the field increases from zero to $H_1$, curve 87 shows the voltage output of cell 29 having vectors that are opposed by the total magnetic field, and curve 86 shows the voltage of cell 29 having vectors that are supported by the magnetic field. At magnetic field intensity of $H_1$, the magnetic vectors in memory cell 29 rotate and indicate the output voltage $V_1$. As the total magnetic field intensity increases between $H_1$ and $H_2$, the magnetic vectors of memory cell 29 continue to rotate and snap to the other direction near a field intensity of $H_2$. Near $H_2$, the vectors of memory cell 29 snap to the opposite direction and the resistance decreases for values of $H_2$ and above. Similarly, the output voltage for an opposite direction total magnetic field is shown between zero and $H_3$ to $H_4$.

Figure 4:
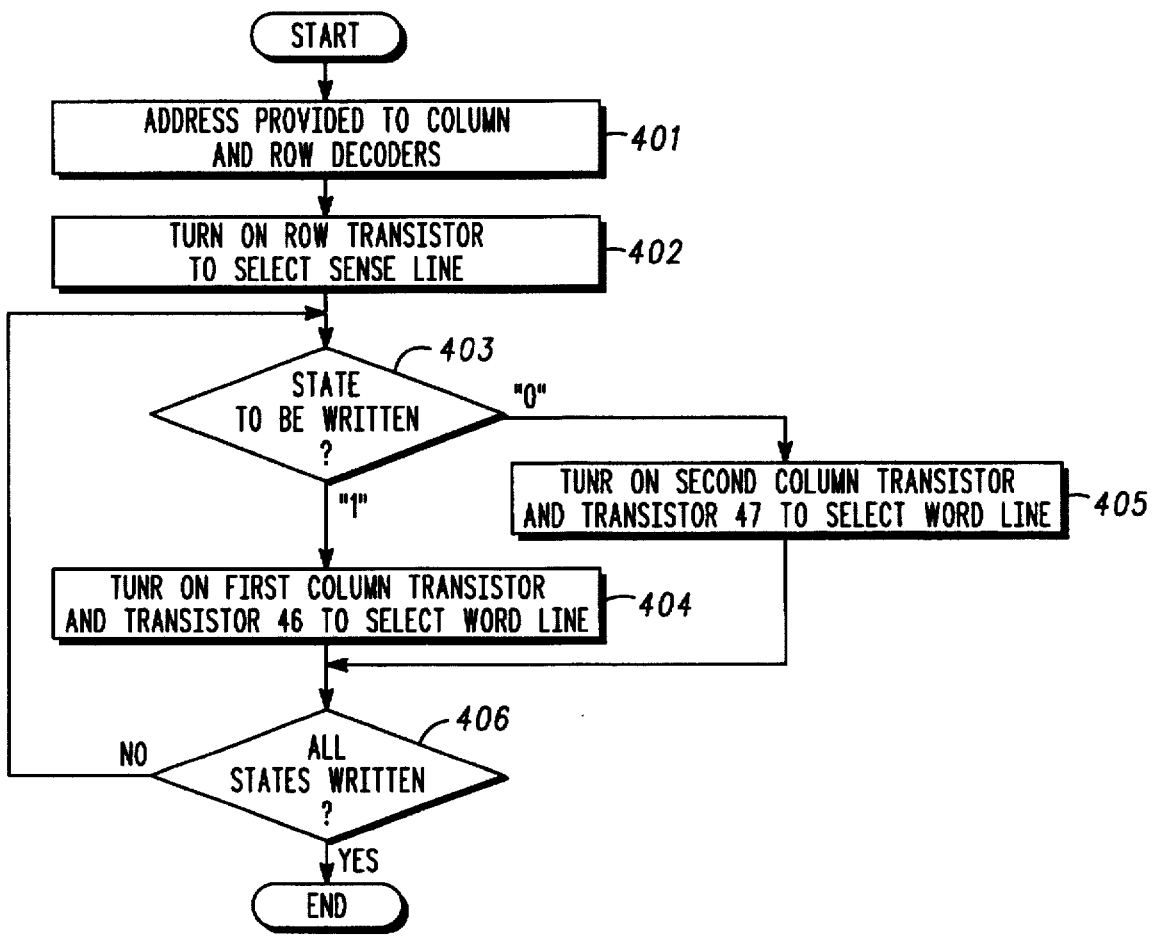
FIG. 4 shows a flowchart in a "write" mode in accordance with the present invention.

FIG. 4 shows a flowchart in a "write" mode in accordance with the present invention. In this flow, sequential selections to word lines 21–24 (see FIG. 1) are achieved as follows: First of all, address signals are provided over address bus 70 to column decoder 40a and row decoder 40b (block 401). Upon receipt of address signals, for example, row decoder 40b provides turn-on signals to gate electrodes of row switching transistor 52 for activating sense line 25 (block 402). By turning on transistor 52, sense line 25 is selected.

Then, column decoder 40a selects word line 21 to store a state in memory cell 29. The content of the state depends on the direction of the word current producing the magnetic field applied to a memory cell 29. When a logic "1" is stored in memory cell 29, first column transistor 44, a switching transistor 46, and transistor 48 are turned on and second column transistor 45 and switching transistor 47 are turned off so that a first word current 91, indicated by solid arrow, flows from power line 42 through transistors 44 and 48, memory cell 29, and switching transistor 46 to ground line 43 (blocks 403 and 404). When a logic "0" is stored in memory cell 29, a reverse magnetic field is applied to memory cell 29. That is, second column transistor 45, switching transistor 47, and transistor 48 are turned on and first column transistor 44 and switching transistor 46 are turned off so that a second word current 92, indicated by dashed arrow, flows from power line 42 through switching transistor 47, memory cell 29, and transistors 48 and 45 to ground line 43 (blocks 403 and 405).

After storing the state in memory cell 29, it is decided if all the states are stored in all the memory cells 29 and 30 related to sense line 25 (block 406). When all the states have not yet been stored, a next step goes to block 403. Then, word line 22, next to word line 21, is selected, that is, first column transistor 44 and switching transistors 46 and 49 are turned on for storing a logic "1" (block 404), and second column transistor 45 and switching transistors 47 and 49 are turned on for storing a logic "0" (blocks 405). All the word lines 21–24 are sequentially selected to store states in memory cells 29 and 30. When all the states are stored, the next sense line is selected according to an address signal.

As mentioned above, once a sense line is selected, every word line related to the sense line is sequentially activated. This sequential activation of word lines does not require sense line selection in every writing into the memory cell, accordingly a higher speed MRAM device can be attained.

Figure 5:
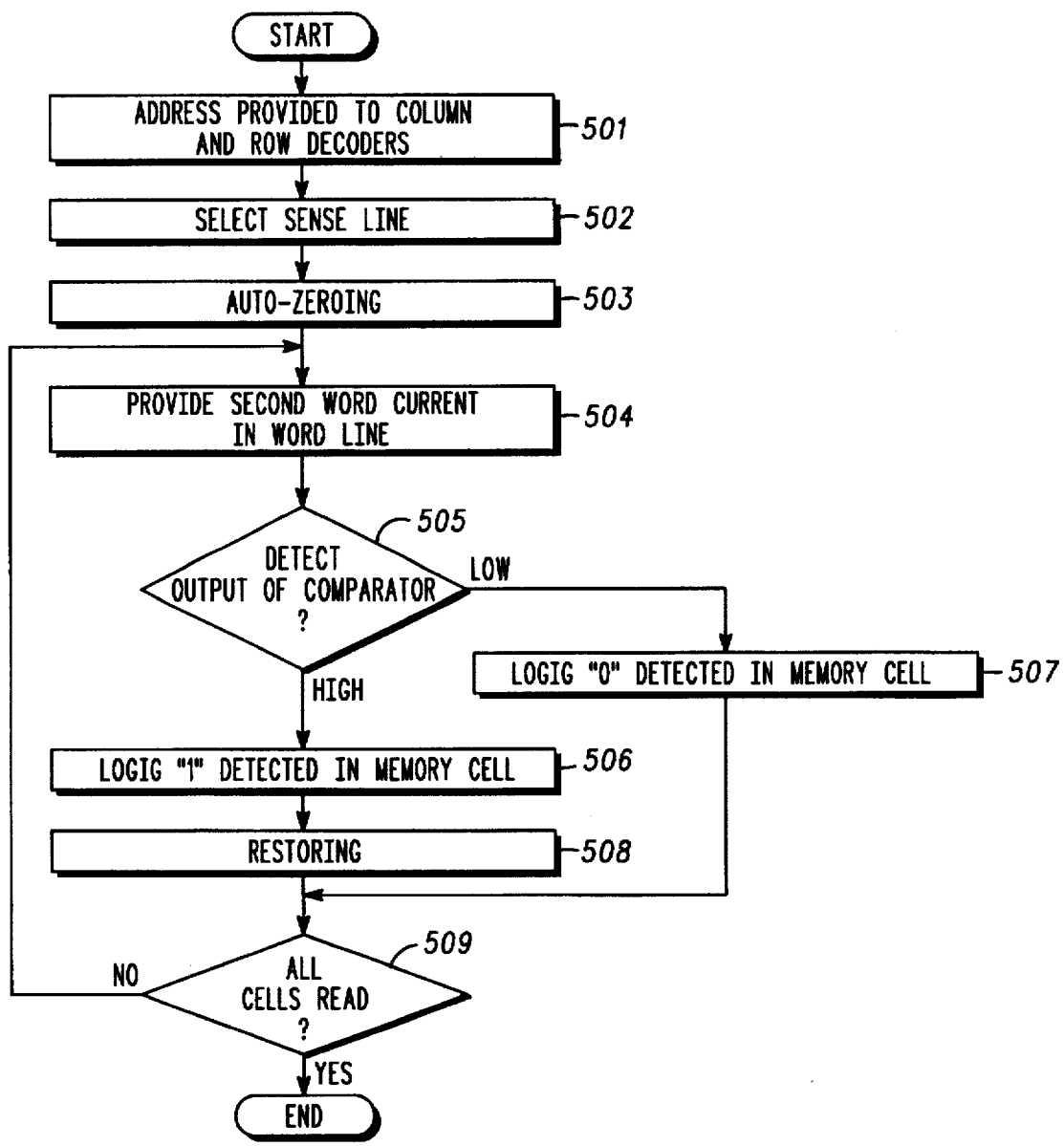
FIG. 5 shows a flowchart in a "read" mode in accordance with the present invention.

FIG. 5 shows a flowchart in a "read" mode in accordance with the present invention. All the word lines are sequentially selected to read states in the memory cells. Initially, address signals are provided over address bus 70 to column decoder 40a and row decoder 40b (block 501). Next, in order to auto-zero sense lines 25 and 35, row decoder 40b provides turn-on signals to row transistors 52 and 53. Output voltage on sense line 25 and a reference voltage on sense line 35 appear on output lines 28 and 38, which are provided to inputs of comparator 60, respectively. Comparator 60 adjusts the difference of input voltages in lines 28 and 38 to a zero output voltage (block 503).

Under the condition of a zero word current, all the memory cells related to sense lines 25 and 35 are placed at zero magnetic field (see FIG. 3). Accordingly, zero voltage is outputted from the output of comparator 60. When the output of comparator 60 increases as word current 92 is applied, it is evaluated that memory cell 29 contains a logic "1". When the output of comparator 60 holds the zero voltage even though word current 92 is applied, it is evaluated that memory cell 29 contains a logic "0".

That is, column decoder 40a provides turn-on signals to second column transistor 45 and switching transistors 47 and 48, thereby word current 92 flows from power line 42 through switching transistor 47, memory cell 29, and transistors 48 and 45 to ground line 43 (block 504). The output of comparator 60 is sensed. When the output rises to a high voltage, a logic "1" is detected (blocks 505 and 506). When the output holds the zero voltage, a logic "0" is detected (blocks 505 and 507). At block 506, if the logic "1" is detected, a part of vectors in memory cell 29 are switched because word current 92 applies a reverse magnetic field to magnetic vectors in memory cell 29. Accordingly, a restoring process is carried out (block 508). This process is made by applying a magnetic field in opposite direction by turning on transistors 44, 46, and 48 to switch magnetic vectors to an original state.

After detecting the state in the memory cell, it is decided if all the memory cells are read (block 509). If all the memory cells have not yet been sensed, a next step goes to block 504 to select next word line until all of the word lines 21–24 and 31–34 have been read. When all the memory cells related to the sense line are sensed, the "read" mode step is completed, and next sense line is selected.

Figure 6:
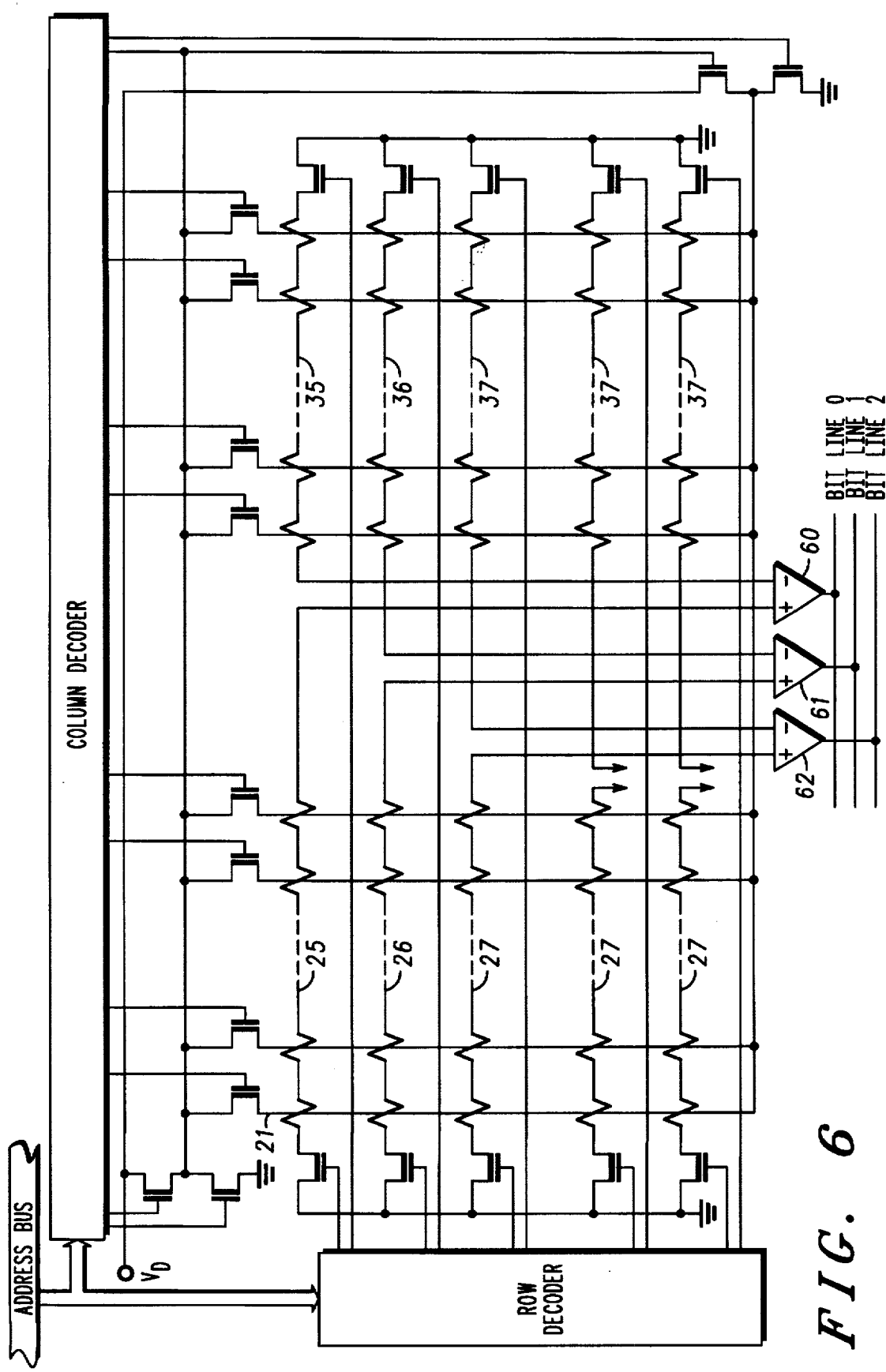
FIG. 6 shows another MRAM circuitry having comparators in each sense line.

FIG. 6 shows another MRAM circuit having a comparator for a group of sense lines with the same word line. The MRAM circuit shown in FIG. 6 is the same as in FIG. 1 except for the comparator portion. Elements of FIG. 6 that have the same reference numbers as FIG. 1 are the same or equivalent as the corresponding FIG. 1 elements.

Sense lines 25 and 35 are connected to inputs of comparator 60, respectively. Similarly, sense lines 26 and 36, and sense lines 27 and 37 are also connected to inputs of comparators 61 and 62, respectively. Outputs of comparators 60–62 are connected to bit lines 0–2, respectively. In this embodiment, all the sense lines 25–27 and 35–37 are selected first, and then the word line 21 is selected. All the memory cells related to the word line 21 are sensed at the same time, and the states in the memory cells are provided to bit lines 0–2 in parallel through comparators 60–62. A plurality of memory cells related to one word line are sequentially accessed and the states contained in the memory cells are outputted in parallel to bit lines. Accordingly, a higher speed read operation can be attained and one word current is used to read many bits, so the power consumption is reduced.

As mentioned above, the invention carries out the sequential selection of word lines to read and write the state in the memory cells. Particularly in "read" mode, no auto-zeroing step is required after selecting the sense line. Therefore, the high speed MRAM is achieved.

We claim:

1. A method of selecting a memory cell in a magnetic random access memory device having a plurality of memory cells arrayed on intersections of word lines and sense lines, comprising the steps of:

providing a sense current in the sense line; and sequentially providing a word current in each word line.

2. The method of claim 1 wherein the step of providing a sense current further includes a step of selecting the sense line in response to an address signal, and the step of sequentially providing a word current in each word line further includes a step of selecting the word line in response to the address signal.

3. The method of claim 2 wherein the step of selecting the word line in response to the address signal further includes a step of decoding the address signal to provide a signal for selecting the word line.

4. The method of claim 1 wherein the step of sequentially providing a word current further includes a step of providing a first word current to store a logic "1" in the memory cell, and a second word current opposite to the first word current in a direction to store a logic "0" in the memory cell.

5. The method of claim 1 further including a step of repeating the step of providing a sense current in a next sense line and the step of sequentially providing the word current in each word line.

6. A method of selecting a memory cell in a magnetic random access memory device having a plurality of memory cells arrayed on intersections of word lines and sense lines, comprising the steps of:

providing a sense current in the sense line;

providing a first word current in the word line;

comparing a potential on the sense line with a reference potential to provide an output; and repeating the step of providing the first word current in the next word line and the step of comparing the potential on the sense line with the reference potential to provide the output.

7. The method of claim 6 wherein the step of providing a sense current in the sense line further includes a step of comparing a potential on the sense line with the reference potential to adjust the output to a zero potential.

8. The method of claim 6 wherein the step of comparing a potential on the sense line with a reference potential further includes a step of evaluating that a first state is stored in the memory cell when the output increases to a high voltage, and a step of evaluating that a second state is stored in the memory cell when the output holds the zero potential.

9. The method of claim 8 wherein the step of evaluating that a first state is stored in the memory cell further includes a step of providing a second word current opposite to the first word current in a direction, the second word current generates a magnetic field enough to switch a state stored in the memory cell.

10. The method of claim 6 wherein the step of comparing a potential on the sense line with a reference potential to provide an output further includes a step of providing the output to a bit line.

11. A method of selecting memory cells associated with a word line in a magnetic random access memory device having a plurality of memory cells arrayed on intersections of word lines and sense lines, comprising the steps of:

providing sense currents in a plurality of the sense lines;

providing a first word current in the word line;

comparing potentials on the sense lines with reference potentials related to the sense lines to provide outputs; and repeating the step of providing the first word current in the next word line and the step of comparing each potential on the sense line with the reference potential related to the sense line to provide the outputs.

12. The method of claim 11 wherein the step of providing sense currents in the sense lines further includes a step of comparing each potential on the sense lines with the reference potential related to the sense line to adjust the output to a zero potential.

13. The method of claim 11 wherein the step of comparing potentials on the sense lines with reference potentials related to the sense lines to provide outputs further includes a step of evaluating that a first state is stored in the memory cell when the output increases to a high voltage, and a step of evaluating that a second state is stored in the memory cell when the output holds the zero potential.

14. The method of claim 13 wherein the step of evaluating that a first state is stored in the memory cell further includes a step of providing a second word current opposite to the first word current in a direction, the second word current generates a magnetic field enough to switch a state stored in the memory cell.

15. The method of claim 11 wherein the step of comparing potentials on the sense lines with reference potentials related to the sense lines to provide outputs further includes a step of providing the outputs to bit lines.

* * * * *